(12) United States Patent
Zhang et al.

(10) Patent No.: US 9,535,148 B2
(45) Date of Patent: Jan. 3, 2017

(54) DYNAMIC CONTRAST ENHANCED MAGNETIC RESONANCE IMAGING WITH HIGH SPATIAL-TEMPORAL RESOLUTION

(71) Applicant: The Board of Trustees of the Leland Stanford Junior University, Palo Alto, CA (US)

(72) Inventors: Tao Zhang, Stanford, CA (US); Joseph Y. Cheng, Stanford, CA (US); John M. Pauly, Stanford, CA (US); Michael Lustig, Berkeley, CA (US); Shreyas S. Vasanawala, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 722 days.

(21) Appl. No.: 13/961,711

(22) Filed: Aug. 7, 2013

(65) Prior Publication Data
US 2015/0042329 A1    Feb. 12, 2015

(51) Int. Cl.
*G01R 33/561*    (2006.01)
*G01R 33/563*    (2006.01)

(52) U.S. Cl.
CPC ..... *G01R 33/5611* (2013.01); *G01R 33/56308* (2013.01)

(58) Field of Classification Search
CPC .................... G01R 33/5611; G01R 33/56308
See application file for complete search history.

(56) References Cited

U.S. PATENT DOCUMENTS

| | | | |
|---|---|---|---|
| 6,841,998 B1 | 1/2005 | Griswold | |
| 7,688,068 B2 | 3/2010 | Beatty | |
| 2009/0196478 A1 | 8/2009 | Lustig et al. | |
| 2011/0241676 A1* | 10/2011 | Busse | G01R 33/56308 324/309 |
| 2013/0044960 A1 | 2/2013 | Zhang et al. | |
| 2013/0182930 A1 | 7/2013 | Trzasko et al. | |

OTHER PUBLICATIONS

Pruessmann et al., "Advances in Sensitivity Encoding With Arbitrary k-Space Trajectories," Magnetic Resonance in Medicine, 46, pp. 638-851, 2001.
Griswold et al., "Generalized Autocalibrating Partially Parallel Acquisitions (GRAPPA)," Magnetic Resonance in Medicine, 47, pp. 1202-1210, 2002.

* cited by examiner

*Primary Examiner* — Gregory H Curran
(74) *Attorney, Agent, or Firm* — Beyer Law Group LLP (57) ABSTRACT

A method of providing dynamic magnetic resonance imaging (MRI) of an object in an MRI system is provided. A magnetic resonance excitation from the MRI system is applied to the object. A magnetic resonance signal is read out through k-space for a plurality of regions with two or three spatial dimensions and a temporal dimension, wherein the read out is pseudo-randomly undersampled in the spatial frequency dimensions and the temporal dimension providing k-space data that is pseudo-randomly undersampled in the spatial frequency dimensions and the temporal dimension. The readout data is used to create a sequential series of spatial frequency data sets by generating interpolated data in the spatial frequency dimensions and the temporal dimension. The sequential series of spatial frequency data sets is used to create temporally resolved spatial images.

14 Claims, 8 Drawing Sheets

FIG. 1

$x_k^t$ - image estimate at time point $t$ after $k^{th}$ iteration
$x_k$ - image estimate at all time points after $k^{th}$ iteration
$y^t$ - k-space measurements at time point $t$
$yc$ - center k-space measurements at all time points
$yc_k$ - reconstructed center k-space measurements at all time points after $k^{th}$ iteration
$F$ - multi-coil Fourier transform operator
$D$ - subsampling operator selecting acquired k-space
$G^t$ - SPIRiT operator at time point $t$
$\Psi$ - multi-coil Wavelet transform operator
$C_b$ - Casorati matrix formulation operator for image partition $b$
$S_\lambda$ - Joint Soft-thresholding
$S_\mu$ - Soft-thresholding
$w$ - Weighting for motion corruption I    Reconstruct the center k-space in case of motion corruption
     for $k = 1, 2, ...$ until convergence:
(A)   $\{u_{k,c}, s_{k,c}, v_{k,c}\} \leftarrow SVD\{yc_k\}$;
     $yc_k \leftarrow u_{k,c} S_\mu\{s_{k,c}\} v_{k,c}^H$
(B)   $yc_k \leftarrow (1-w) yc_k + w yc$
     Update center k-space: $yc = yc_k$ after convergence II   $G^t \leftarrow AutoCalibrate(y^t)$, for $t = 1, 2, ..., T$
     Initialize $x_0^t \leftarrow F^{-1} D^T y^t$, for $t = 1, 2, ..., T$
     for $k = 1, 2, ...$ until convergence:
(A)   $m_k^t \leftarrow G x_{k-1}^t$, for $t = 1, 2, ..., T$
(B)   $z_k \leftarrow \Psi^{-1} S_\lambda\{\Psi m_k\}$
(C)   for every image partition $b$ ($p_k = U_b p_{k,b}$, $q_k = U_b q_{k,b}$):
     $p_{k,b} \leftarrow \{C_b z_k\}$;
     $\{u_{k,b}, s_{k,b}, v_{k,b}\} \leftarrow SVD\{p_{k,b}\}$;
     $q_{k,b} \leftarrow C_b^T\{u_{k,b} S_\mu\{s_{k,b}\}(v_{k,b})^H\}$
(D)   $x_k^t \leftarrow F^{-1}[(1-w)(I - D^T D)(F q_k^t) + w D^T y^t]$, for $t = 1, 2, ..., T$

DYNAMIC CONTRAST ENHANCED MAGNETIC RESONANCE IMAGING WITH HIGH SPATIAL-TEMPORAL RESOLUTION

GOVERNMENT RIGHTS

This invention was made with Government support under contracts EB009690 and EB015891 awarded by the National Institutes of Health. The Government has certain rights in this invention.

BACKGROUND OF THE INVENTION

This invention relates generally to magnetic resonance imaging (MRI).

Magnetic resonance imaging (MRI) is a non-destructive method for the analysis of materials, and provides medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

MRI is based on nuclear spins, which can be viewed as vectors in a three-dimensional space. During an MRI process, each nuclear spin responds to four different effects: precession about the main magnetic field, nutation about an axis perpendicular to the main field, and both transverse and longitudinal relaxation. In steady-state MRI processes, a combination of these effects occurs periodically.

Compared with other modalities, such as X-ray, CT and ultrasound, MRI takes longer time, sometimes several minutes, for data acquisition to generate clinically useful images. Undesirable imaging artifacts may appear due to the long scan time. MRI using multiple receiving coils (phased array) has been introduced to shorten the scan time and increase signal to noise ratio (SNR). This fast imaging technique, known as parallel imaging (PI), can significantly accelerate data acquisition, and therefore reduce imaging artifacts and improve image quality.

Parallel imaging uses multiple channels and multiple receiver coils that each receives signals from a subset of the total volume and combines data of the multiple receiver coils to provide an image for a total volume.

Parallel imaging methods exploit the sensitivity of the receiver coils to accelerate MRI acquisitions. SENSE based reconstructions, as described in Pruessmann et al., "Advances in sensitivity encoding with arbitrary k-space trajectories," MRM 46(4):638-51 (2001), provide a complete general reconstruction from arbitrary k-space sampling. SENSE attempts to reconstruct the imaged object exactly, with no coil sensitivity weighting. To do so, it requires an accurate explicit measurement of the coil sensitivities. The GRAPPA based reconstructions, as described in Griswold et al, "Generalized autocalibrating partially parallel acquisitions (GRAPPA)," MRM 47(6):1202-10 (2002), are becoming increasingly more popular. GRAPPA type reconstructions do not attempt to reconstruct the exact original object. Instead, they attempt to reconstruct each coil image separately—a significantly relaxed requirement. Therefore it requires only implicit coil sensitivity information in the form of correlations between pixels in k-space. The correlation measurements are obtained by calibration. U.S. Pat. No. 6,841,998 by Griswold, issued Jan. 11, 2005 entitled "Magnetic Resonance Imaging Method And Apparatus Employing Partial And Parallel Acquisition, Wherein Each Coil Produces A Complete K-Space Datasheet," which is incorporated herein by reference for all purposes, also describes a GRAPPA based reconstruction. U.S. Pat. No. 7,688,068 by Beatty, issued Mar. 30, 2010, entitled "System and Method For Using Parallel Imaging With Compressed Sensing, which is incorporated herein by reference for all purposes," discloses a parallel imaging system, which uses compressed sensing techniques to reconstruct an MR image.

SUMMARY OF THE INVENTION

In accordance with the invention, a method of providing dynamic magnetic resonance imaging (MRI) of an object in an MRI system is provided. A magnetic resonance excitation from the MRI system is applied to the object. A magnetic resonance signal encoded in k-space for a plurality of regions with two or three spatial dimensions and a temporal dimension, wherein the read out is pseudo-randomly undersampled in the spatial frequency dimensions and the temporal dimension providing k-space data that is pseudo-randomly undersampled in the spatial frequency dimensions and the temporal dimension. The readout data is used to create a sequential series of spatial frequency data sets by generating interpolated data in the spatial frequency dimensions and the temporal dimension. The sequential series of spatial frequency data sets is used to create temporally resolved spatial images.

In another manifestation of the invention a method for magnetic resonance imaging (MRI) on an MRI system is provided. A magnetic resonance excitation is applied. A magnetic resonance signal is read out and encoded using k-space winders, wherein some of the winders overlap for a length of the winders. The readout data from overlapping lengths of winders is used to estimate motion of each region of a plurality of regions. The estimated motion of each region of the plurality of regions is used to provide a motion weighting for each region of the plurality of regions.

The invention and objects and features thereof will be more readily apparent from the following detailed description and appended claims when taken with the drawings.

DETAILED DESCRIPTION OF ILLUSTRATED EMBODIMENTS

Dynamic Contrast Enhanced (DCE) MRI is commonly used in clinical abdominal and pelvic examinations for abdominal vessel evaluation and lesion detection and characterization. To better visualize fine abdominal vessels and small lesions, a high spatial resolution is required. On the other hand, a high temporal resolution is necessary to capture the contrast uptakes of abdominal organs and blood vessels, which usually last for only a few minutes or less. However, due to the large volumetric coverage needed in abdominal DCE MRI, often a tradeoff between spatial and temporal resolution has to be made. Abdominal DCE MRI is further challenging for pediatric patients: small anatomical structures in pediatric patients require an even higher spatial resolution and rapid hemodynamics requires a finer temporal resolution.

Respiratory motion is another major concern in abdominal DCE MRI. Acquisition with breath-holding is one possible approach. However, very few patients can hold their breath perfectly for a long time (up to a minute), so the entire hemodynamics after contrast injection is unlikely to be captured within one breath-held acquisition. Another approach to reduce motion artifacts is respiratory triggering. But the temporal resolution is compromised with respiratory triggering. A free-breathing data acquisition is most favorable in abdominal DCE MRI, but nonrigid motion correction is required to remove motion artifacts.

U.S. Patent Application Publication 2009/0196478, by Lustig et al, entitled "Auto Calibration Imaging Reconstruction Method From Arbitrary K-Space Sampling", published on Aug. 6, 2009 and U.S. Patent Application Publication 2013/0044960, by Zhang et al. entitled "Compression For Three Dimensional Autocalibrating Parallel Imaging with Cartesian Sampling," published on Feb. 21, 2013, which are both incorporated by reference for all purposes discloses reconstruction and compression methods.

To achieve a high spatial-temporal resolution in abdominal DCE MRI, the data acquisition needed to be accelerated. Assume the acquisition parameters at each temporal point, including the spatial resolution and field of view (FOV), are fixed, then the higher acceleration is achieved, the better temporal resolution is obtained. For Cartesian MRI, several fast imaging methods can be used to accelerate data acquisition. The first type of method is parallel imaging (PI). PI uses a set of coil arrays with different coil sensitivities for collecting data. The coil sensitivities are used to accelerate MR data acquisition by undersampling k-space and to reconstruct the missing data. The second type is compressed sensing (CS), which has been developed more recently. CS exploits the data redundancy (also known as sparsity) in MR images, which essentially requires less data to be acquired. The data redundancy in dynamic images exists in both spatial and temporal domains: images at each single temporal point are sparse in some transform domain (e.g., Wavelet); the entire dynamic image series are also sparse in the temporal domain, which is known as the low-rank property. Dynamic images can be further partitioned into small image blocks, which are even more rank-deficient in a local image region.

To achieve the highest acceleration, a combination of PI and CS can be used. $L_1$-SPIRiT has been successfully applied in pediatric DCE MRI. $L_1$-SPIRiT combines PI and a sparsity constraint together. In this work, a Sparsity and Low-Rank enhanced SPIRiT (SLR-SPIRiT) is utilized. SLR-SPIRiT further exploits the temporal sparsity (locally low-rank) and an even higher acceleration can be achieved. To address the respiratory motion in a free-breathing acquisition, a motion-weighted data consistency is used. SLR-SPIRiT used in an embodiment of the invention can achieve a free-breathing DCE with high spatial-temporal resolution and does not suffer from noticeable motion artifacts. This embodiment is demonstrated in pediatric abdominal DCE MRI datasets with both breath-held acquisition (R=19.3) and free-breathing acquisition (R=7.9).

Technical Description

PI reconstructions rely on the coil sensitivities that can be explicitly measured or implicitly estimated. In abdominal MRI, it is very difficult to measure explicit coil sensitivity accurately. Therefore PI reconstructions that do not require explicit coil sensitivities are preferred. This type of PI reconstructions is known as autocalibrating parallel imaging (ACPI). Among various ACPI methods, SPIRiT has been shown to provide superior image quality. Let x be a matrix of the estimated coil-by-coil images, y a matrix of the acquired k-space data from all coils, F a Fourier operator applied individually on each coil data, D a subsampling operator that selects only the sampled k-space points, G an image-space SPIRiT operator. Then SPIRiT can be formulated as the following problem:

$$\text{Minimize}_x \|(G-I)x\|$$

$$\text{Subject to } \|DFx-y\| \leq \epsilon \qquad (1)$$

where G can be calculated from the fully-sampled center k-space. $\|(G-I)x\|$ represents the consistency with the calibration, while $\|DF x-y\|$ represents the consistency with the data acquisition. SPIRiT reconstruction problems can be easily solved by a projection onto convex sets (POCS) algorithm.

Sparsity and $L_1$-SPIRiT

CS is another type of fast imaging method that exploits the sparsity of MRI images. MRI images can usually be represented by much fewer coefficients after a sparsifying transform (e.g., Wavelet). When data acquisition is done with multiple coils, images of individual coils are weighted by the spatially-varying coil sensitivities. A joint-sparsity of multiple coils can be applied as a constraint for image reconstruction. $L_1$-SPIRiT combines joint-sparsity and SPIRiT to enable higher acceleration. Let $\Psi$ be a wavelet transform applied individually on each coil data. Then $L_1$-SPIRiT can be formulated as:

$$\text{Minimize}_x \text{Joint } L_1(\Psi x)$$

$$\text{Subject to } \|DFx-y\| \leq \epsilon_1$$

$$\|(G-I)x\| \leq \epsilon_2 \qquad (2)$$

$L_1$-SPIRiT can also be easily solved by a POCS algorithm.

Low-Rankness and SLR-SPIRiT

To further accelerate data acquisition, the low-rank property of DCE images needs to be considered. Assume DCE images are acquired at T time points. Let $x_t$ be a matrix of the estimated coil-by-coil images at time t (t=1, 2, . . . , T), and $X_C$ the Casorati matrix of $x_1, x_2, \ldots, x_T$ ($X_C$ has T columns with each column the reformatted vector of $x_t$). This $X_C$ is usually low-rank in dynamic or DCE MRI images. For simplicity, let x be a matrix of the estimated coil-by-coil images at all time points, and C be an operator that transform x into its Casorati form. Then the Casorati formation can be simplified as $X_C$=Cx. Let $y_1, y_2, \ldots, y_T$ be the acquired k-space data and $D_t$ the subsampling operator for time point t. The accelerated DCE data can be reconstructed by solving the following optimization problem:

$$\text{Minimize}_x \|Cx\|$$

$$\text{Subject to } \|D_t F x_t - y_t\| \leq \epsilon, t=1,2,\ldots T \qquad (3)$$

where $\|Cx\|$ is the nuclear norm of Cx.

Recent studies have shown that the low-rank property of dynamic images can be further exploited in a small image region. Assume the estimated image can be divided into B non-overlapped partitions. Let $C_b$ be an operator that transform the partition b (b=1, 2, ..., B) of x into its Casorati form. Then the locally low rank optimization can be formulated as:

Minimize$_x \Sigma_b \|C_b x\|$

Subject to $\|D_t F x_t - y_t\| \leq \epsilon, t=1,2, \ldots T$ \hfill (4)

This low rank optimization is in fact a variation of the compressed sensing problem. Therefore pseudo-random sampling pattern is required. Sampling patterns should be varying at different time points as well.

To achieve the highest spatial-temporal resolution, an embodiment of SLR-SPIRiT is provided. It is a combination of SPIRiT, sparsity constraint and locally low rank constraint. Using the previous notation of $C_b$, F, $D_t$ and $\Psi$, and let $G_t$ be an image-space SPIRiT operator at time point t. SLR-SPIRiT method can be formulated as:

Minimize$_x$ Joint $L_1(\Psi_x) + \mu (\Sigma_b \|C_b x\|)$

Subject to $\|D_t F x_t - y_t\| \leq \epsilon_1$ $\|(G_t - I)x_t\| \leq \epsilon_2, t=1,2, \ldots T$ \hfill (5)

where Joint $L_1$ is the joint sparsity of multiple coils as well as multiple time points. Note that in SLR-SPIRiT, SPIRiT operator $G_t$ is calculated separately for each time point and the low rank (locally low rank) constraint is separate from this SPIRiT (or PI) operation. This is one major difference compared to most k-t methods where PI and time correlation is combined together. Previous studies have shown that k-t methods that use interpolation from neighboring k-space at adjacent time points may suffer from several artifacts like residual aliasing and blurring when images at adjacent points are very different. SLR-SPIRiT is robust against these artifacts since the time correlation is only enforced by the locally low rank constraints.

Motion Consideration

Motion often corrupts MRI data acquisition, especially in abdominal MRI. Respiratory motion can cause artifacts such as image blurring and ghosting. Data acquisition with perfect breath-held is ideal for reducing motion. However, many patients can only hold their breath in a very limited period of time (less than half a minute). Moreover, for pediatric patients, anesthesia is often required. Free-breathing acquisition can remove the need of anesthesia in pediatric patients and benefit many other adult patients as well.

To enable free-breathing data acquisitions, the SLR-SPIRiT method can be modified to incorporate a motion-weighted data consistency. Instead of being completely consistent with the data acquisition, the reconstruction is partially consistent with data acquisition based on how corrupted the acquired data were. Significantly corrupted data should be removed from data consistency in the reconstruction. Pulse sequence with self-navigation (e.g., Butterfly) can capture respiratory motion and generate this motion weighting.

Assume w is the motion weighting, the modified SLR-SPIRiT method can be formulated as:

Minimize$_x$ Joint $L_1(\Psi_x) + \mu (\Sigma_b \|C_b x\|)$

Subject to $\|w(D_t F x_t - y_t)\| \leq \epsilon_1$ $\|(G_t - I)x_t\| \leq \epsilon_2, t=1,2, \ldots T$ \hfill (6)

Note that with motion weighting, the center k-space is no longer fully sampled. Therefore the calibration of the SPIRiT kernel cannot be directly calculated. To obtain a fully sampled center k-space, a low-rank reconstruction in Eq. (3) can first be performed on the center k-space before SLR-SPIRiT is carried out.

SLR-SPIRiT Flowchart and Algorithm

For SNR and acceleration consideration, dedicated coils with many channels (e.g., 32-channel torso coils) are preferred. However, computation also increases significantly when many coils are used. To reduce computation, coil compression is used. The raw data from many channels can be compressed into few virtual coils before the SLR-SPIRiT reconstruction.

Figure 1:
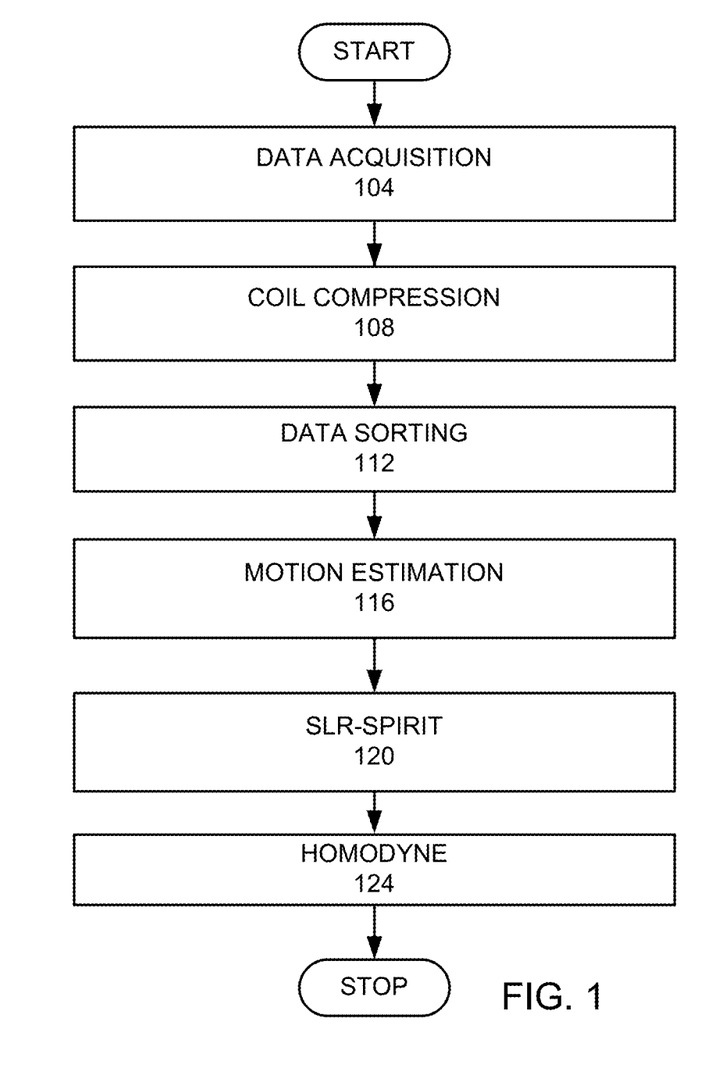
FIG. 1 is a flow chart of SLR-SPIRiT used in an embodiment of the invention.
Figure 2:
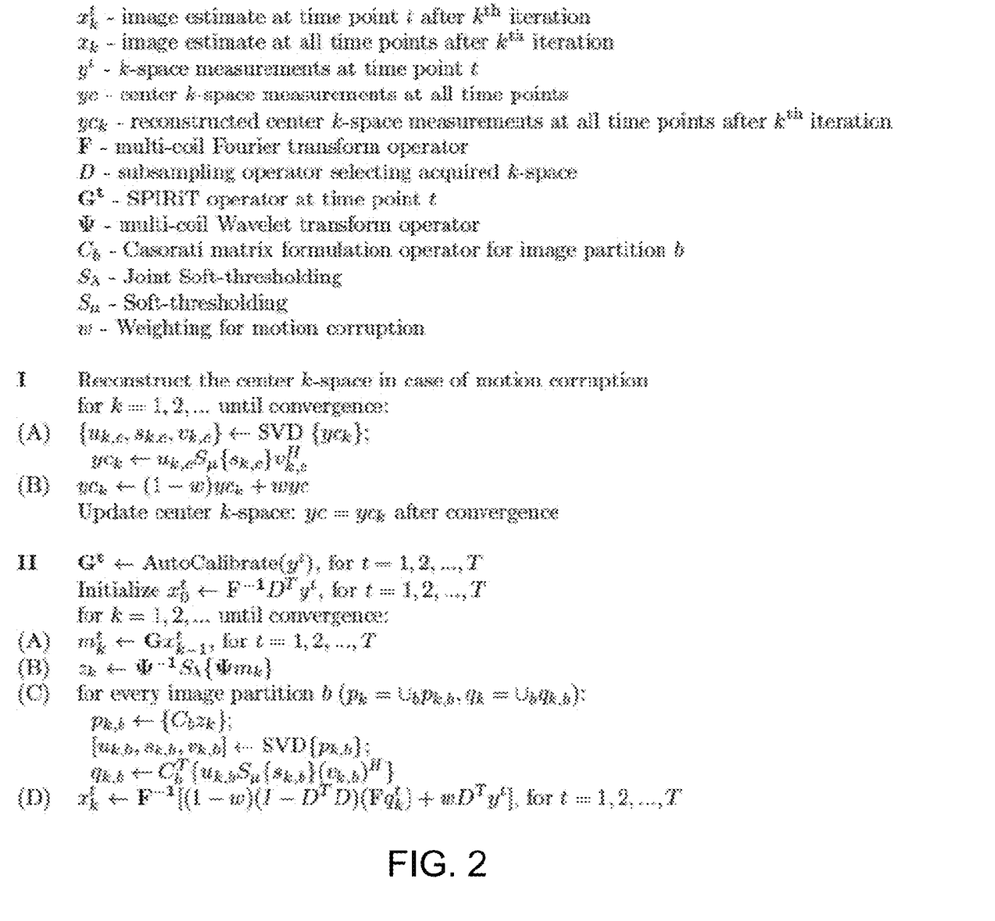
FIG. 2 shows a POCS reconstruction algorithm of the SLR-SPIRiT.

FIG. 1 is a flow chart of SLR-SPIRiT used in an embodiment of the invention. Data is acquired (step 104). For 3D Cartesian acquisition, the readout direction is fully sampled. Therefore, an inverse Fourier transform of the raw data can be performed along the readout direction. Different variable density pseudo-random patterns are used for each phase. A navigator (Butterfly) is turned on to track respiratory motion. Coil compression is provided (step 108). The coil compression is performed on the raw data matrix to save the computation for the following reconstruction. The data is sorted (step 112). The actual data matrix is constructed with a raw data matrix (virtual coils) and an acquisition view table. Motion is estimated (step 116). A SLR-SPIRiT reconstruction is performed (step 120). The SLR-SPIRiT reconstruction can be decoupled into separable 2D problems. This is a slice-by-slice reconstruction, where a slice is referred to a spatial location in the readout direction. The reconstruction can be easily sped up by parallel computing. A POCS reconstruction algorithm of the SLR-SPIRiT is shown in FIG. 2. A homodyne operation is done in the readout direction (step 124).

Experiments and Results

In an embodiment of the invention, two pediatric DCE datasets were acquired on a 3T GE MR750 scanner with a 32-channel cardiac coil. The first dataset was a 2-year-old patient dataset acquired using a traditional SPGR sequence with fat saturation and breath-holding. The acquisition parameters were: TE(partial echo)/TR=0.9/3.9 ms, matrix=192×230×60, 20 temporal phases, averaged net acceleration at each temporal phase 19.3 (R=19.3), in-plane spatial resolution 0.9×0.9 mm$^2$, slice thickness 2.4 mm and temporal resolution approximately 3 seconds. The second dataset was a 6-year-old patient dataset acquired using Butterfly sequence with fat saturation and free-breathing. The acquisition parameters were: TE(partial echo)/TR=1.3/3.2 ms, matrix=192×180×80, 18 temporal phases, averaged net acceleration at each temporal phase 7.9 (R=7.9), in-plane spatial resolution 1.3×1.3 mm$^2$, slice thickness 2 mm and temporal resolution approximately 6.3 seconds. The above described SLR-SPIRiT reconstruction was performed on both datasets.

Figure 3:
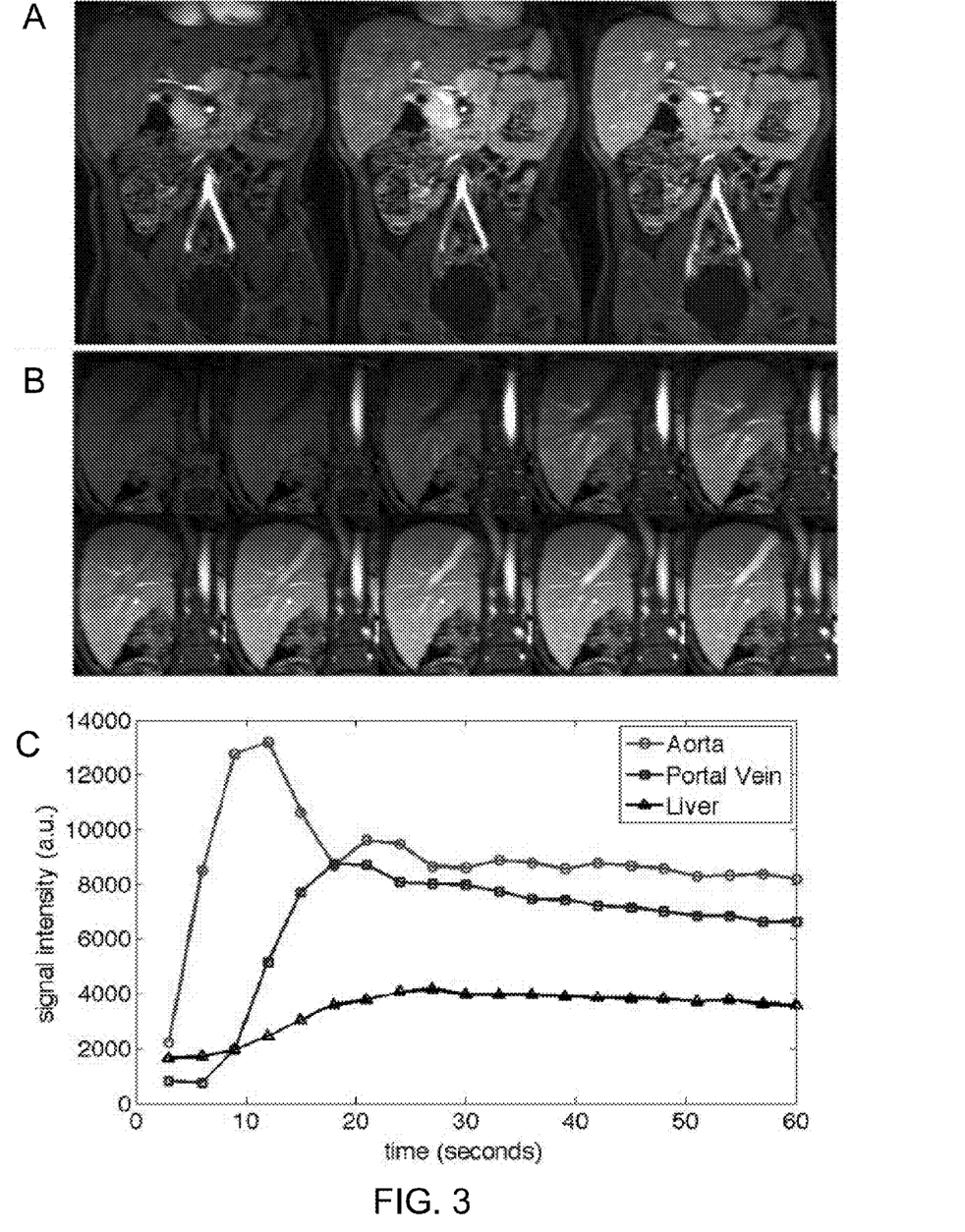
FIGS. 3A-C shows reconstruction results of a first dataset for the 2-year-old patient.

The reconstruction results of the first dataset for the 2-year-old patient are shown in FIGS. 3A-C. Examples of the reconstruction at three different temporal phases are shown in FIG. 3A. The reconstructed images did not suffer from obvious aliasing artifact even with the very high acceleration. High spatial resolution can be seen as fine vessels in the liver were well-delineated. A portion of the magnified image (liver region) of the first ten temporal phases are shown in FIG. 3B. The contrast uptakes in the dual blood system in the liver can be seen, which evidence the high temporal resolution. Signal intensities of the manually segmented abdominal aorta, portal vein and liver are plotted in FIG. 3C. These results demonstrate the feasibility of depicting small rapid enhancing structures in a small child with a breath-held acquisition.

Figure 4:
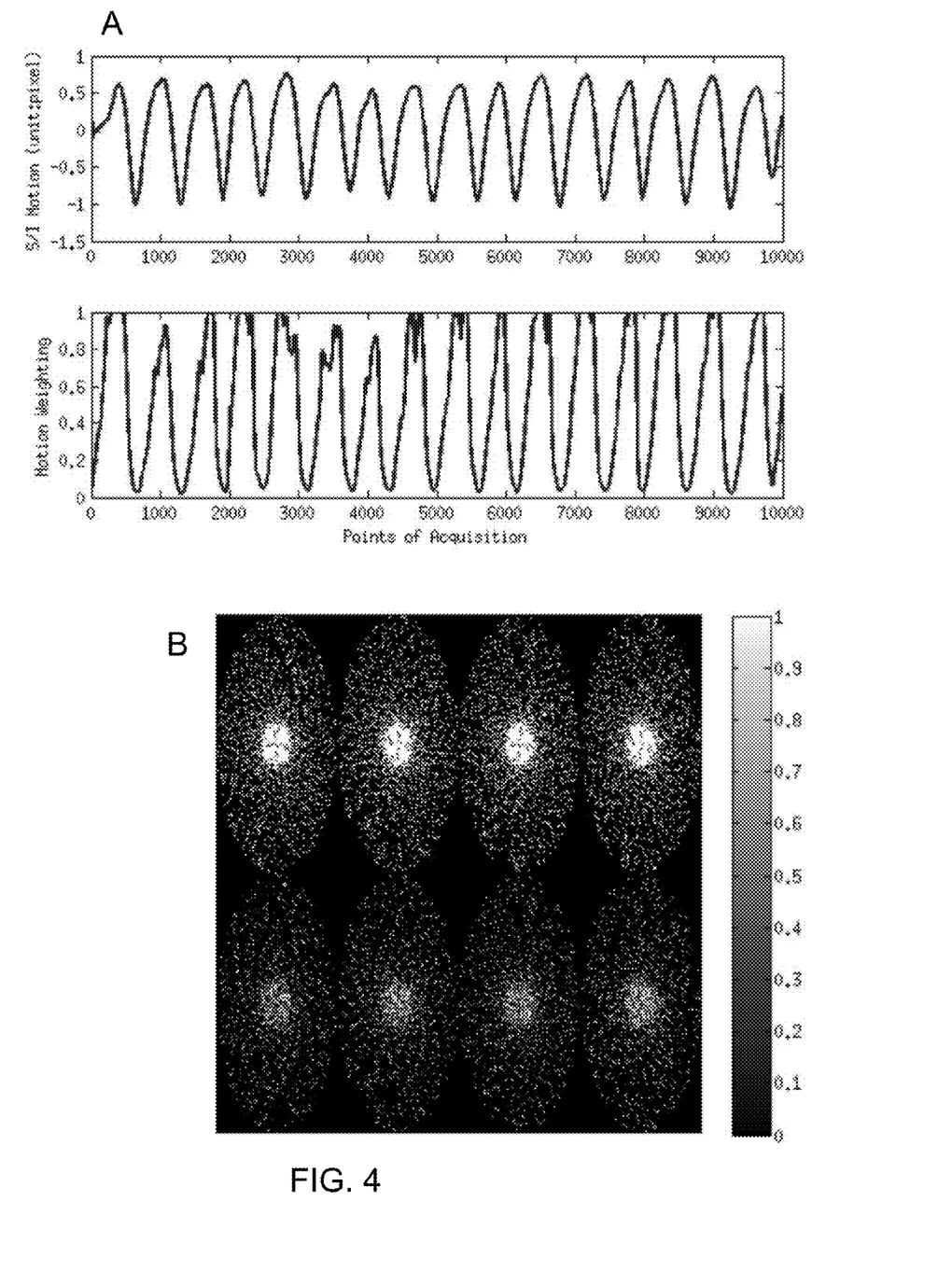
FIGS. 4A-C shows reconstruction results of a second dataset for the 6 year-old patient.
Figure 4C:
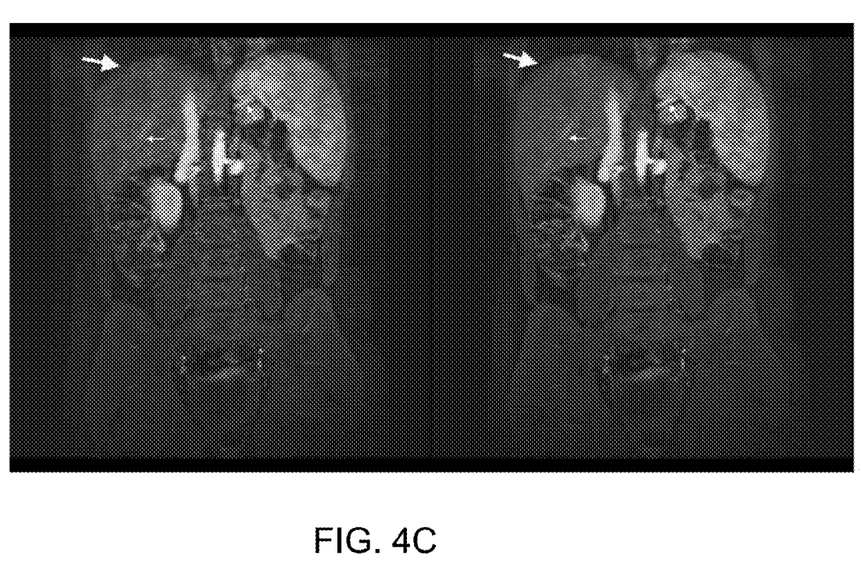

The reconstruction results of the second dataset for the 6 year-old patient are shown in FIGS. 4A-C. The estimated respiratory motion from the Butterfly sequence in S/I direction and the corresponding motion weighting are shown in FIG. 4A. The top graph motion tracked the S/I (Superior/Inferior) navigator. The bottom graph is a graph of the corresponding motion weighting applied in the SLR-SPIRiT reconstruction. The original sampling patterns at the first 4 temporal phases and the corresponding motion-weighted sampling patterns are shown in FIG. 4B with the first temporal phases without motion weighting shown in the top images and the first 4 temporal phases with motion weighting shown in the bottom images. An example of SLR-SPIRiT reconstructions without (left) and with motion weighting (right) are shown in FIG. 4C. SLR-SPIRiT with motion weighting did not suffer from motion artifacts such as image blurring and ghosting. Fine vessels in the liver were also well-delineated by SLR-SPIRiT with motion weighting (arrows). These results demonstrate the feasibility of depicting small rapid enhancing structures in a small child with a free-breathing acquisition.

DCE MRI is widely used in a clinical setting to examine abdominal aorta and its branches as well as to detect and characterize lesions. The main limits for current abdominal DCE MRI methods are limited spatial-temporal resolution and possible respiratory motion artifacts. Some embodiments of the invention address both of these two challenges.

An embodiment of the invention achieves a very high spatial-temporal resolution. This embodiment can successfully reconstruct highly undersampled data with good image quality. For pediatric abdominal DCE MRI, in vivo datasets with approximate acceleration factor 19 with breath-holding acquisition have been tested.

Another advantage of an embodiment is that the embodiment allows a free-breathing acquisition. The reconstruction does not suffer from obvious motion artifacts, such as ghosting and image blurring.

The combination of these two advantages enables a free-breathing DCE MRI with high spatial-temporal resolution. This is especially important in a pediatric MRI setting, where anesthesia can potentially be removed.

Embodiments of the inventions add the following new features. A high acceleration (thus high spatial-temporal resolution) can be achieved without noticeable artifacts. A free-breathing data acquisition is provided that removes the need of respiratory triggering or breath-holding, and potentially the necessity of anesthesia in pediatric patients. An image reconstruction method that is robust to nonrigid motion is also provided.

The requirements and suggestions for the implementation of an embodiment of the invention are as follows: A motion-navigation technique (e.g., Butterfly) is required to generate motion weighting for the proposed method. For multi-phase acquisition, pseudo-random variable density sampling patterns should be different for different temporal phases. To enable large acceleration, high density coil arrays with large channel counts, e.g., 32-channel torso coils are preferred.

Variations and Modifications

Various embodiments may be used. In an embodiment, the low-rankness in DCE MRI appears in both the temporal domain and multiple coils. Coil compression exploits most of the low-rank property of the coil sensitivities in the coil arrays. Even after coil compression, it is still possible to consider the low-rank property of both time and coil together.

In another embodiment, the low-rank constraint is applied in a local image region. Since a slice-by-slice reconstruction is used, images at each slice may already have a very low rankness so that the low rank constraint can be directly applied to the entire image instead of small image blocks.

In an embodiment where data is acquired with large coil arrays, motion estimates from each coil represent a local nonrigid motion. An autofocusing method can be applied to further correct nonrigid respiratory motion. However, computation will increase because of multiple reconstructions with different motion corrections.

An embodiment uses motion estimates from Butterfly sequences for motion weighting. Other embodiments use other motion estimates from navigation devices. For example, respiratory motion can be recorded by a respiratory belt and the recorded respiratory signal can be used to calculate the motion weighting.

In another embodiment, a simple POCS algorithm is used. In another embodiment, another algorithm such as nonlinear conjugate gradient method can also be used to solve the problem in Eq. (6).

Various embodiments provide the following new features. A high acceleration (thus high spatial-temporal resolution) can be achieved without noticeable artifacts; A free-breathing data acquisition is provided that removes the need of respiratory triggering or breath-holding, and potentially the necessity of anesthesia in pediatric patients; An image reconstruction method that is robust to nonrigid motion is also provided.

Figure 5:
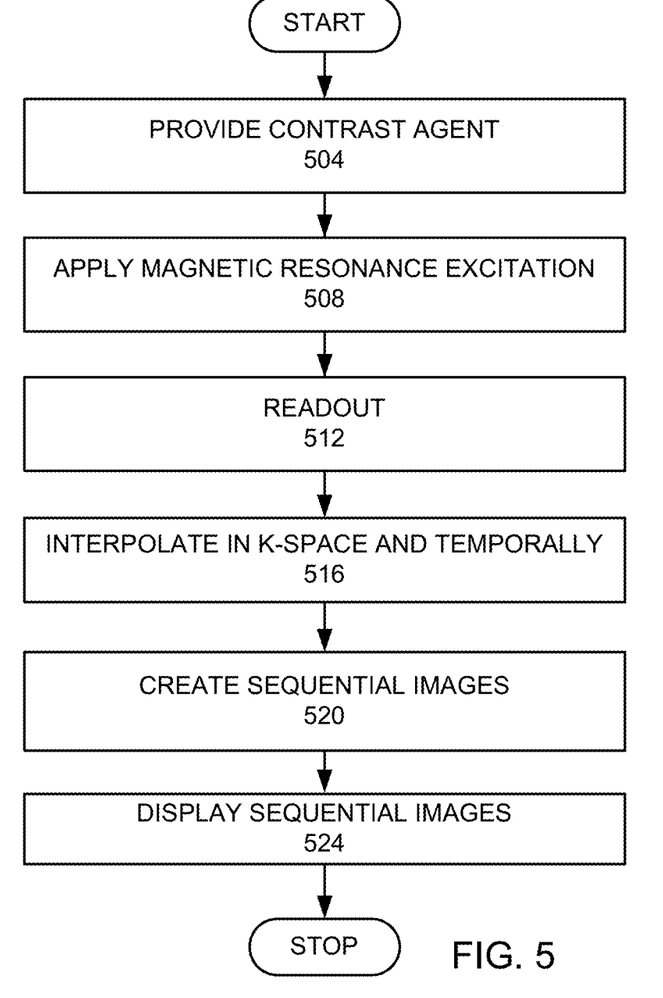
FIG. 5 is a flow chart of an embodiment of the invention.

To facilitate the understanding of the invention, FIG. 5 is a high level flow chart of an embodiment of the invention. A contrast agent is provided to an object in an MRI system (step 504). An MRI excitation is applied to the object in the MRI system (step 508). A readout is performed (step 512). The readout is able to readout the magnetic field by the MRI system through k-space for a plurality of regions of the object with three spatial dimensions and a temporal dimension, wherein the reading out is pseudo-randomly undersampled in the two spatial dimensions and the temporal dimension and providing readout data that is pseudo-randomly undersampled in the three spatial dimensions and the temporal dimension. In an embodiment, this may be performed by the 3D Cartesian acquisition described in step 104 of FIG. 1. The data is simultaneously interpolated in k-space and temporally to recover missing data in both k-space and temporally (step 516). In one embodiment, the transition signal acquisition comprises performing a 3D Fourier Transform acquisition with two phase encode directions chosen in a pseudo-random pattern. The data is then transformed to create sequential temporally resolved images (step 520). The sequential images are displayed creating a dynamic resonance image (step 524).

Figure 6:
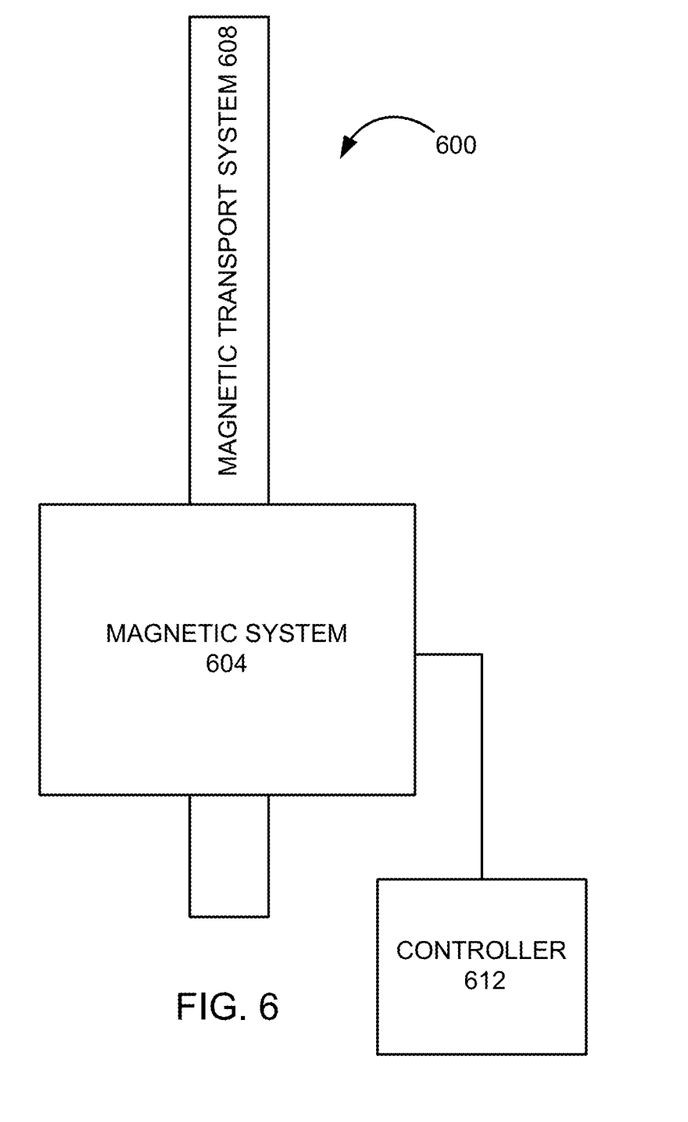
FIG. 6 is a schematic top view of a magnetic resonance imaging (MRI) system that may be used in an embodiment of the invention.

FIG. 6 is a schematic top view of a magnetic resonance imaging (MRI) system 600 that may be used in an embodiment of the invention. The MRI system 600 comprises a magnet system 604, a patient transport table 608 connected to the magnet system, and a controller 612 controllably connected to the magnet system. In one example, a patient would lie on the patient transport table 608 and the magnet system 604 would pass around the patient. The controller 612 would control magnetic fields and radio frequency (RF) signals provided by the magnet system 604 and would receive signals from detectors in the magnet system 604.

Figure 7:
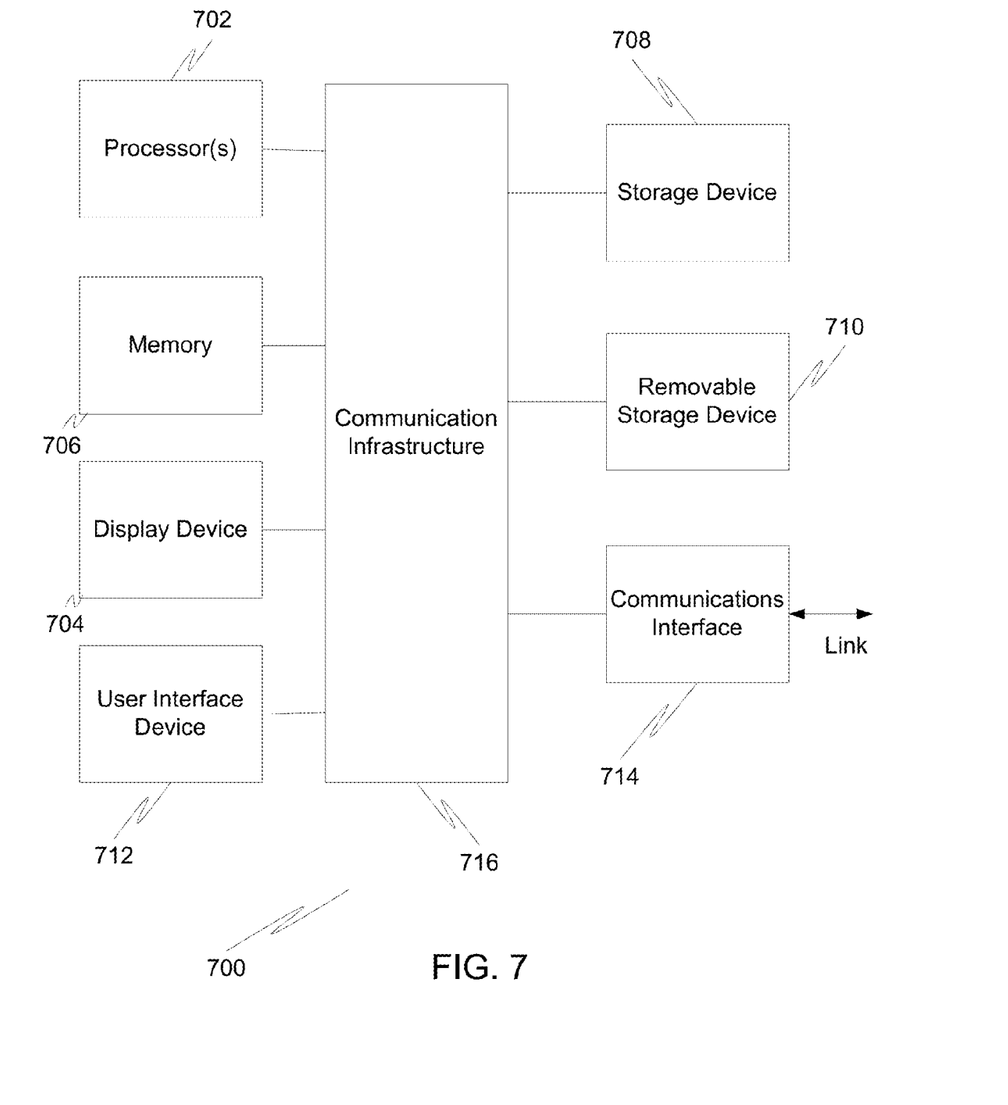
FIG. 7 illustrates a computer system that may be used in an embodiment of the invention.

FIG. 7 is a high level block diagram showing a computer system 700, which may be used to provide the controller 612. The computer system may have many physical forms ranging from an integrated circuit, a printed circuit board, and a small handheld device up to a computer. The computer system 700 includes one or more processors 702, and further can include an electronic display device 704, a main memory 706 (e.g., random access memory (RAM)), storage device 708 (e.g., hard disk drive), removable storage device 710 (e.g., optical disk drive), user interface devices 712 (e.g., keyboards, touch screens, keypads, mice or other pointing devices, etc.), and a communication interface 714 (e.g., wireless network interface). The communication interface 714 allows software and data to be transferred between the computer system 700 and external devices via a link. The system may also include a communications infrastructure 716 (e.g., a communications bus, cross-over bar, or network) to which the aforementioned devices/modules are connected.

Information transferred via communications interface 714 may be in the form of signals such as electronic, electromagnetic, optical, or other signals capable of being received by communications interface 714, via a communication link that carries signals and may be implemented using wire or cable, fiber optics, a phone line, a cellular phone link, a radio frequency link, and/or other communication channels. With such a communications interface, it is contemplated that the one or more processors 702 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method of providing dynamic magnetic resonance imaging (MRI) of an object in an MRI system, comprising the steps of:
    a) applying a magnetic resonance excitation from the MRI system to the object;
    b) reading out magnetic resonance signal encoded in spatial frequency for a plurality of spatial regions with two or three spatial dimensions and a temporal dimension, wherein the read out is pseudo-randomly undersampled in the spatial frequency dimensions and the temporal dimension providing k-space data that is pseudo-randomly undersampled in the spatial frequency dimensions and the temporal dimension;
    c) using the readout data to create a sequential time series of spatial frequency data sets by generating interpolated data in the spatial frequency dimensions and the temporal dimension;
    d) using the sequential time series of spatial frequency data sets to create a temporal series of spatial images;
    e) measuring movement of each spatial region of the plurality of spatial regions and providing motion weighting to each spatial region of the plurality of spatial regions according to the measured movement; and
    f) using the motion weighting for each spatial region to create an image, wherein spatial regions with greater motion have lower weighting.

2. The method, as recited in claim 1, further comprising: transforming the sequential time series of spatial frequency data into a sequential series of images to provide dynamic MRI; and
displaying the dynamic MRI on the MRI system.

3. The method, as recited in claim 2, wherein the read out is provided by a plurality of parallel array elements.

4. The method, as recited in claim 3, further comprising adding a contrast agent to the object, wherein the dynamic MRI displays uptakes of the contrast agent in the object.

5. The method, as recited in claim 1, wherein the measuring movement of each region of a plurality of regions, comprises using readout data from overlapping lengths of winders to estimate motion.

6. The method, as recited in claim 1, further comprising formulating low-rank spatial-temporal matrix for undersampled spatial and temporal data.

7. The method, as recited in claim 6, further comprising defining a plurality of image regions wherein a low-rank spatial temporal matrix is provided for each of the plurality of image regions.

8. The method, as recited in claim 7, wherein the sampling has a variable density, with higher sampling nearer to a center of a spatial region of the plurality of spatial regions.

9. The method, as recited in claim 8, wherein a readout direction is fully sampled, and wherein the transforming of k-space data into a sequential series of images to provide dynamic MRI is in the readout direction.

10. The method, as recited in claim 2, further comprising adding a contrast agent to the object, wherein the dynamic MRI displays uptakes of the contrast agent in the object.

11. The method, as recited in claim 1, further comprising defining a plurality of image regions wherein a low-rank spatial temporal matrix is provided for each of the plurality of image regions.

12. The method, as recited in claim 1, wherein the sampling has a variable density, with higher sampling nearer to a center of a region of the plurality of regions.

13. A method for magnetic resonance imaging (MRI) on an MRI system, comprising the steps of:
    a) applying a magnetic resonance excitation;
    b) reading out a magnetic resonance signal encoded in k-space using winders, wherein some of the winders overlap for a length of the winders;
    c) using readout data from overlapping lengths of winders to estimate motion of each region of a plurality of regions;

d) using the estimated motion of each region of the plurality of regions to provide a weighting for each region of the plurality of regions.

14. The method of claim 13, further comprising using the motion weighting for each region to create an image, wherein regions with greater motion have lower weighting.

* * * * *